(12) United States Patent
Sun et al.

(10) Patent No.: US 10,304,731 B2
(45) Date of Patent: May 28, 2019

(54) DAMASCENE OXYGEN BARRIER AND HYDROGEN BARRIER FOR FERROELECTRIC RANDOM-ACCESS MEMORY

(71) Applicant: Cypress Semiconductor Corporation, San Jose, CA (US)

(72) Inventors: Shan Sun, Monument, CO (US); Fan Chu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/875,594

(22) Filed: Jan. 19, 2018

(65) Prior Publication Data

US 2018/0182770 A1 Jun. 28, 2018

Related U.S. Application Data

(63) Continuation of application No. 14/494,097, filed on Sep. 23, 2014, now abandoned.
(Continued)

(51) Int. Cl.
*H01L 21/768* (2006.01)
*H01L 27/11507* (2017.01)
(Continued)

(52) U.S. Cl.
CPC .. *H01L 21/76841* (2013.01); *H01L 21/28291* (2013.01); *H01L 21/76829* (2013.01);
(Continued)

(58) Field of Classification Search
CPC ......... H01L 21/28273; H01L 21/28291; H01L 21/76829; H01L 21/76831; H01L 21/76832; H01L 21/76834; H01L 21/76841; H01L 21/76843; H01L 21/7685; H01L 21/76852; H01L 21/76801; H01L 21/76802; H01L 21/76804; H01L 21/76805; H01L 21/76807;
(Continued)

(56) References Cited

U.S. PATENT DOCUMENTS 5,382,817 A 1/1995 Kashihara et al.
6,249,014 B1 6/2001 Bailey
(Continued)

FOREIGN PATENT DOCUMENTS

JP 2008300396 A 12/2008
JP 2009272319 A 11/2009

OTHER PUBLICATIONS

Mikolajick, T., "Material Aspects in Emerging Nonvolatile Memories," The Electrochemical Society, Symposium: F1—Science and Technology of Dielectrics in Emeriging Fields, Apr. 27-May 2, 2003; 24 pages.
(Continued)

*Primary Examiner* — Eduardo A Rodela

(57) ABSTRACT

Disclosed herein is an apparatus that includes a ferroelectric capacitor disposed on a damascene barrier film, and fabrication methods thereof. The damascene barrier film includes a hydrogen barrier region and an oxygen barrier region, with the oxygen barrier being in contact with a bottom surface of the ferroelectric capacitor. Other embodiments are also disclosed herein.

17 Claims, 13 Drawing Sheets

Related U.S. Application Data

(60) Provisional application No. 61/929,226, filed on Jan. 20, 2014.

(51) Int. Cl.
   *H01L 49/02* (2006.01)
   *H01L 21/28* (2006.01)
   *H01L 27/11502* (2017.01)
   *H01L 29/51* (2006.01)
   *H01L 27/11509* (2017.01)

(52) U.S. Cl.
   CPC .. *H01L 21/76832* (2013.01); *H01L 21/76834* (2013.01); *H01L 21/76843* (2013.01); *H01L 27/11502* (2013.01); *H01L 27/11507* (2013.01); *H01L 27/11509* (2013.01); *H01L 28/57* (2013.01); *H01L 29/516* (2013.01)

(58) Field of Classification Search
   CPC ............. H01L 27/11502; H01L 29/516; H01L 2924/1441; H01L 28/75
   See application file for complete search history.

(56) References Cited

U.S. PATENT DOCUMENTS

| | | | |
|---|---|---|---|
| 6,867,447 B2* | 3/2005 | Summerfelt | H01L 27/11507 257/295 |
| 6,906,908 B1 | 6/2005 | Yabuki et al. | |
| 6,953,950 B2 | 10/2005 | Sashida | |
| 6,984,861 B2 | 1/2006 | Yamada et al. | |
| 7,095,068 B2 | 8/2006 | Kumura et al. | |
| 8,440,508 B2 | 5/2013 | Udayakumar et al. | |
| 2003/0075753 A1* | 4/2003 | Chu | H01L 28/91 257/308 |
| 2003/0124791 A1* | 7/2003 | Summerfelt | H01L 21/31122 438/238 |
| 2003/0143800 A1 | 7/2003 | Hall et al. | |
| 2004/0084701 A1 | 5/2004 | Kanaya et al. | |
| 2005/0118795 A1 | 6/2005 | Hidaka et al. | |
| 2006/0267060 A1* | 11/2006 | Kutsunai | H01L 21/76829 257/296 |
| 2009/0072287 A1 | 3/2009 | Noda | |
| 2009/0224301 A1 | 9/2009 | Yamakawa et al. | |
| 2011/0316058 A1 | 12/2011 | Gambino et al. | |
| 2012/0313218 A1 | 12/2012 | Fujimori et al. | |

OTHER PUBLICATIONS

USPTO Advisory Action for U.S. Appl. No. 14/494,097 dated Jan. 8, 2018: 2 pages.
USPTO Advisory Action for U.S. Appl. No. 14/494,097 dated Oct. 21, 2016: 3 pages.
USPTO Advisory Action for U.S. Appl. No. 14/494,097 dated Nov. 17, 2015: 3 pages.
USPTO Applicant Initiated Interview Summary for U.S. Appl. No. 14/494,097 dated Aug. 11, 2016: 3 pages.
USPTO Final Rejection for U.S. Appl. No. 14/494,097 dated Apr. 14, 2017; 15 pages.
USPTO Final Rejection for U.S. Appl. No. 14/494,097 dated Jun. 7, 2016; 7 pages.
USPTO Final Rejection for U.S. Appl. No. 14/494,097 dated Aug. 9, 2016; 15 pages.
USPTO Final Rejection for U.S. Appl. No. 14/494,097 dated Sep. 9, 20215; 11 pages.
USPTO Final Rejection for U.S. Appl. No. 14/494,097 dated Oct. 27, 2017; 13 pages.
USPTO Non-Final Rejection for U.S. Appl. No. 14/494,097 dated Jan. 4, 2016; 10 pages.
USPTO Non-Final Rejection for U.S. Appl. No. 14/494,097 dated Jun. 3, 2015; 11 pages.
USPTO Non-Final Rejection for U.S. Appl. No. 14/494,097 dated Jun. 26, 2017; 13 pages.
USPTO Non-Final Rejection for U.S. Appl. No. 14/494,097 dated Nov. 30, 2016; 14 pages.
USPTO Requirement for Restriction Election for U.S. Appl. No. 14/494,097 dated Feb. 20, 2015; 6 pages.

* cited by examiner

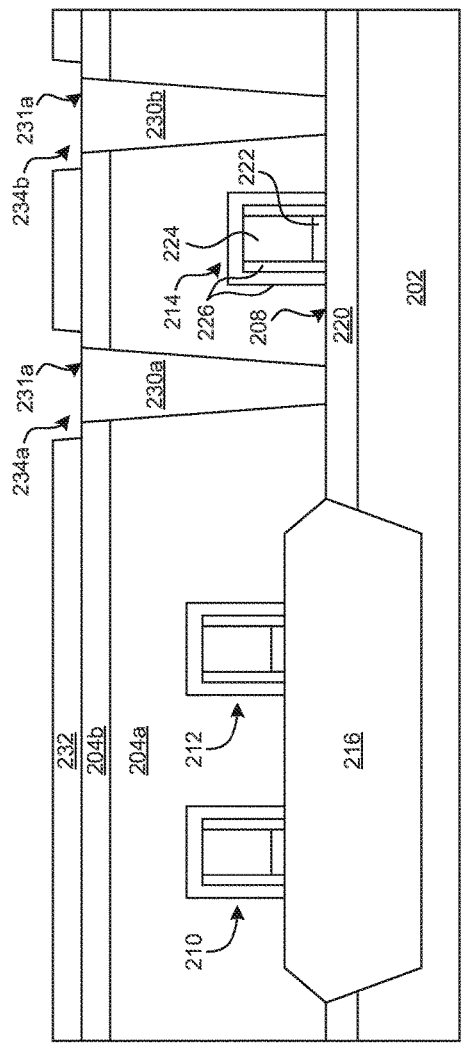
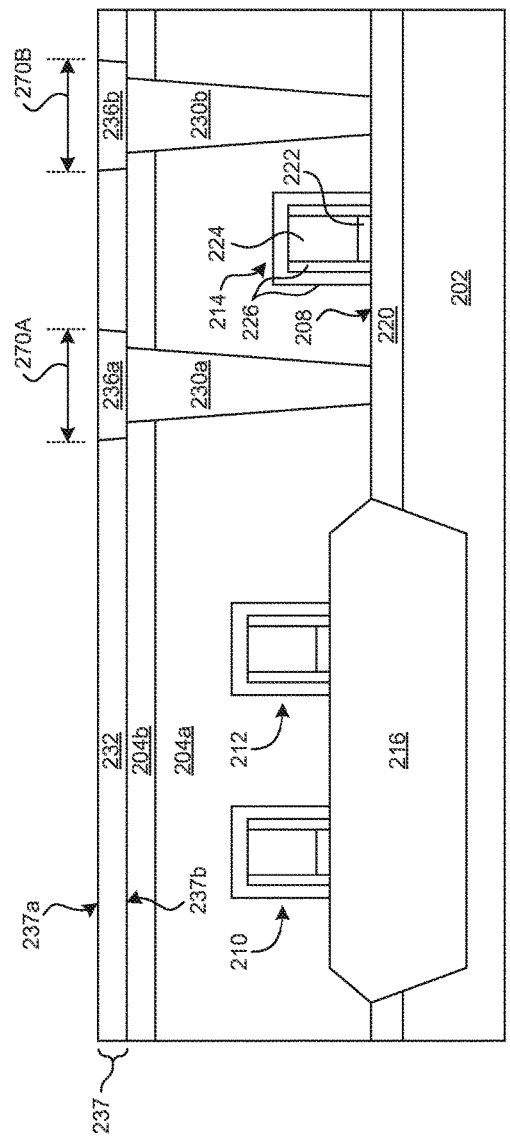
FIG. 2E
FIG. 2F

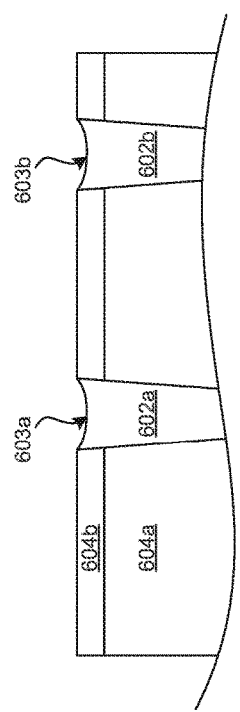
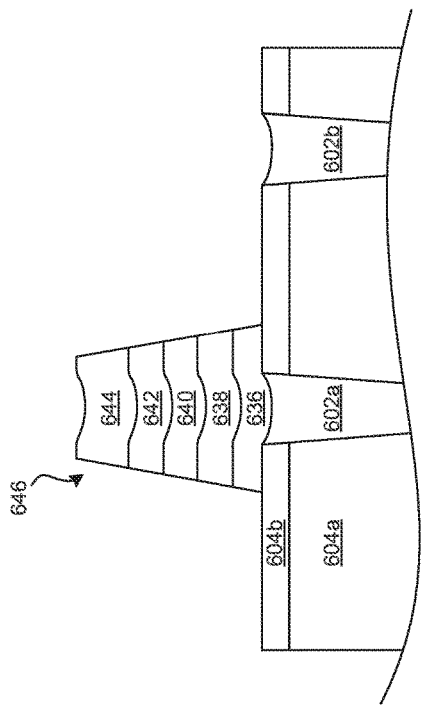
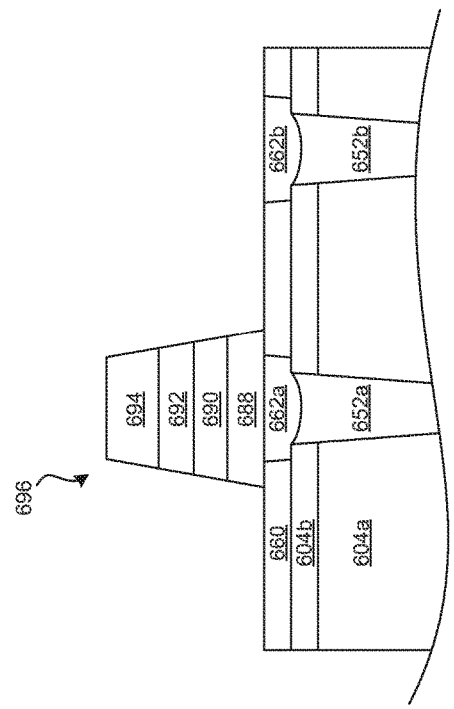
FIG. 6A
FIG. 6B
FIG. 6C
FIG. 6D

DAMASCENE OXYGEN BARRIER AND HYDROGEN BARRIER FOR FERROELECTRIC RANDOM-ACCESS MEMORY

CROSS REFERENCE TO RELATED APPLICATION

This application is a Continuation of U.S. patent application Ser. No. 14/494,097, filed Sep. 23, 2014, which claims the benefit of U.S. Provisional Patent Application No. 61/929,226, filed Jan. 20, 2014, all of which are hereby incorporated by reference herein in their entirety.

TECHNICAL FIELD

Embodiments described herein relate to semiconductor devices, and more particularly to the fabrication of ferroelectric random-access memory devices.

BACKGROUND

Ferroelectric random-access memories (FRAM) typically include a grid or an array of storage elements or cells, each including at least one ferroelectric capacitor and one or more associated transistors to select the cell and control reading or writing thereto. When an external electric field is applied across a ferroelectric material of a ferroelectric capacitor in the cell, dipoles in the material align with the field direction. After the electric field is removed, the dipoles retain their polarization state. Data is stored in the cells as one of two possible electric polarizations in each data storage cell. For example, in a one transistor-one capacitor (1T1C) cell, a "1" may be encoded using a negative remnant polarization, and a "0" may be encoded using a positive remnant polarization.

The ferroelectric capacitor ("ferrocapacitor") in an FRAM cell typically includes a ferroelectric material, such as lead zirconate titanate (PZT) between an upper electrode and a lower electrode. The transistors in the cells are typically metal-oxide-semiconductor (MOS) transistors fabricated using a standard or baseline complementary-metal-oxide-semiconductor (CMOS) process flows, involving the formation and patterning of conducting, semiconducting, and dielectric materials. The composition of these materials, as well as the composition and concentration of processing reagents, and temperature used in such a CMOS process flow are stringently controlled for each operation to ensure that the resultant MOS transistors function properly. Materials and processes typically used to fabricate the ferroelectric capacitor differ significantly from those of the baseline CMOS process flow, and can detrimentally impact the MOS transistors.

Moreover, stringent design rules may be utilized when fabricating interconnect layers to interface the ferroelectric components with CMOS layers, as the potential for defects and errors in the manufacturing process (e.g., misalignments, incomplete etching steps, etc.) increases with the number of subsequent processing steps.

BRIEF DESCRIPTION OF THE DRAWINGS

The present invention will be understood more fully from the detailed description that follows and from the accompanying drawings and the appended claims provided below, where:

FIG. 2E illustrates another cross sectional view of portions of an FRAM cell during the fabrication thereof according to one embodiment of the present invention;

FIG. 2F illustrates another cross sectional view of portions of an FRAM cell during the fabrication thereof according to one embodiment of the present invention;

FIG. 6A illustrates a cross sectional view of a portion of an FRAM cell prior to the formation of a defect;

FIG. 6B illustrates a cross sectional view of a portion of an FRAM cell after formation of a defect;

FIG. 6C illustrates prevention of a processing defect in an FRAM cell formed according to one embodiment of the present invention; and FIG. 6D illustrates a ferrocapacitor formed without a defect according to one embodiment of the present invention.

DETAILED DESCRIPTION

Figure 1:
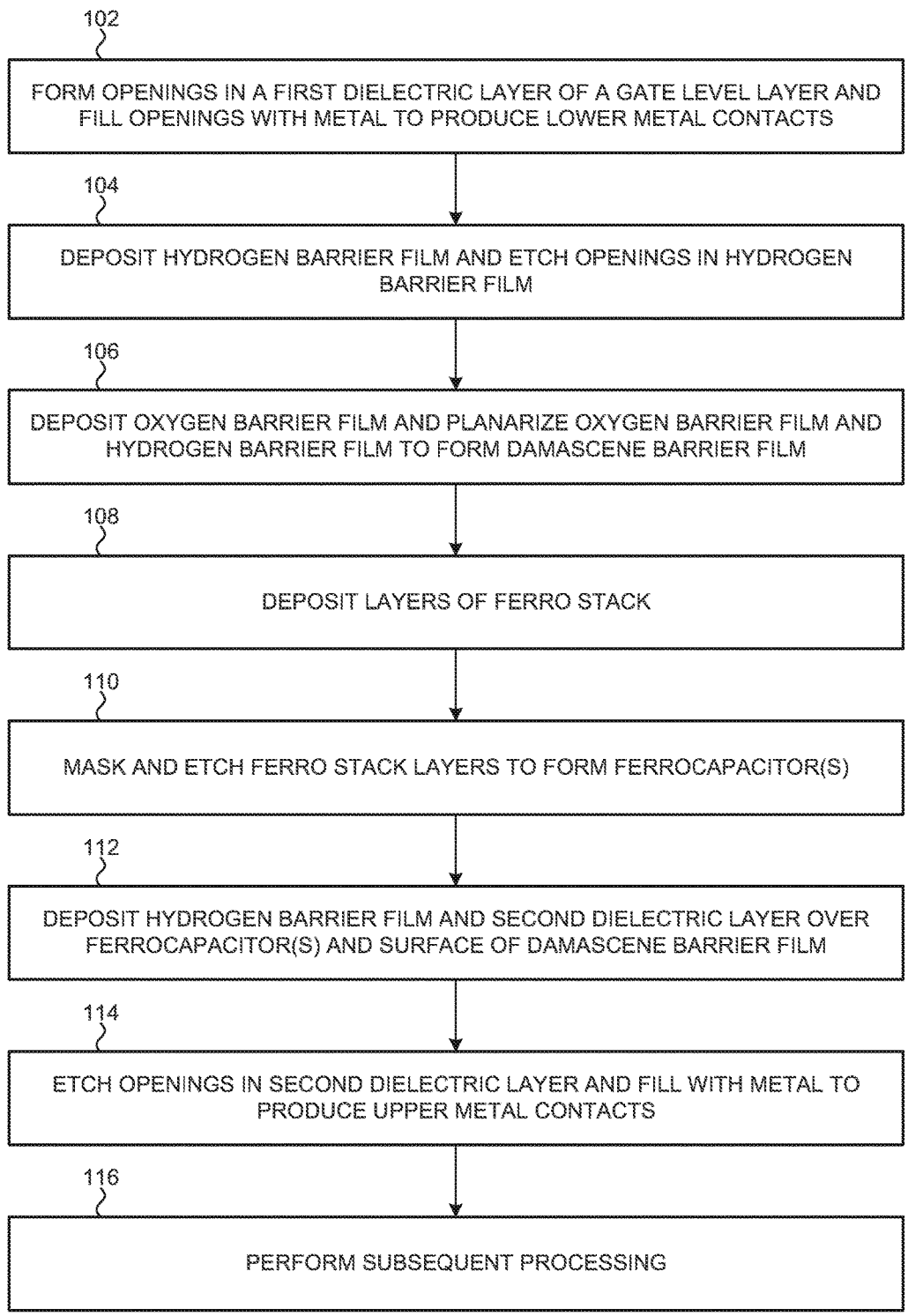
FIG. 1 is a flow diagram illustrating a method for fabricating FRAM cells according to one embodiment of the present invention.

Non-volatile memory cells including CMOS transistors and embedded ferroelectric capacitors formed according to methods of the present disclosure include damascene hydrogen and oxygen barrier films (or damascene barrier films) into the devices during fabrication reduce defects introduced by misalignment of metal contacts as well as reduce vertical dimensions of the ferroelectric capacitors.

In one embodiment, an apparatus includes a damascene barrier film having a first upper surface and a first lower surface. The damascene barrier film includes a hydrogen barrier region and a first oxygen barrier region. A ferrocapacitor, having a top surface, a bottom surface, and at least one sidewall, is disposed on the first upper surface of the damascene barrier film such that the lower surface of the ferrocapacitor is in contact with the first oxygen barrier region. A hydrogen barrier film is disposed along the at least one sidewall of the ferrocapacitor and at least a first portion of the upper surface of the ferrocapacitor. In some embodiments, the lower surface of the ferrocapacitor is in further contact with the hydrogen barrier region. In other embodiments, the lower surface of the ferrocapacitor fully contacts the first oxygen barrier region without contacting the hydrogen barrier region.

In another embodiment, a method includes forming a damascene barrier film disposed above a gate level layer, the damascene barrier film including a hydrogen barrier region and a first oxygen barrier region. The method further includes forming a ferrocapacitor on the damascene barrier film such that a lower surface of the ferrocapacitor contacts the first oxygen barrier region.

Embodiments of an FRAM cell including a damascene barrier film are described herein with reference to figures. Specifically, the damascene barrier film may be disposed below one or more ferrocapacitors within a dielectric layer. By incorporating an oxygen barrier region within the damascene barrier film, an individual oxygen barrier layer may be eliminated during the deposition of a ferrocapacitor stack when forming the ferrocapacitor. Moreover, pre-forming the oxygen barrier layer in this way allows for a decrease in height of the ferrocapacitor. This in turn reduces a total etch time when forming the ferrocapacitor, thus reducing the amount of etching experienced by the topmost layer of the ferrocapacitor while also eliminating defects that may arise due to incomplete etching (e.g., such as conductive oxygen barrier residues that can potentially create electrical shorting). Moreover, the damascene barrier film may also serve to eliminate defects that arise from misaligned metal contacts, by providing a large area interconnect region between metal contacts from different layers. It is noted that particular embodiments may be practiced without one or more of these specific details, or in combination with other known methods, materials, and apparatuses.

As used herein, the term "damascene barrier film" refers to a barrier film formed using a damascene process, resulting in a barrier film having a first barrier material that fills gaps or trenches previously formed in a second barrier material.

An embodiment of an apparatus including FRAM cells having a damascene barrier film, and a method of fabricating and integrating such ferroelectric capacitors into a standard or baseline CMOS process flow will now be described in detail with reference to FIG. 1 and FIGS. 2A-2K. FIG. 1 is a flow diagram illustrating a method for fabricating FRAM cells according to one embodiment of the present invention. FIGS. 2A-2K illustrate cross sectional views of portions of an FRAM cell during the fabrication thereof according to one embodiment of the present invention.

Figure 2A:
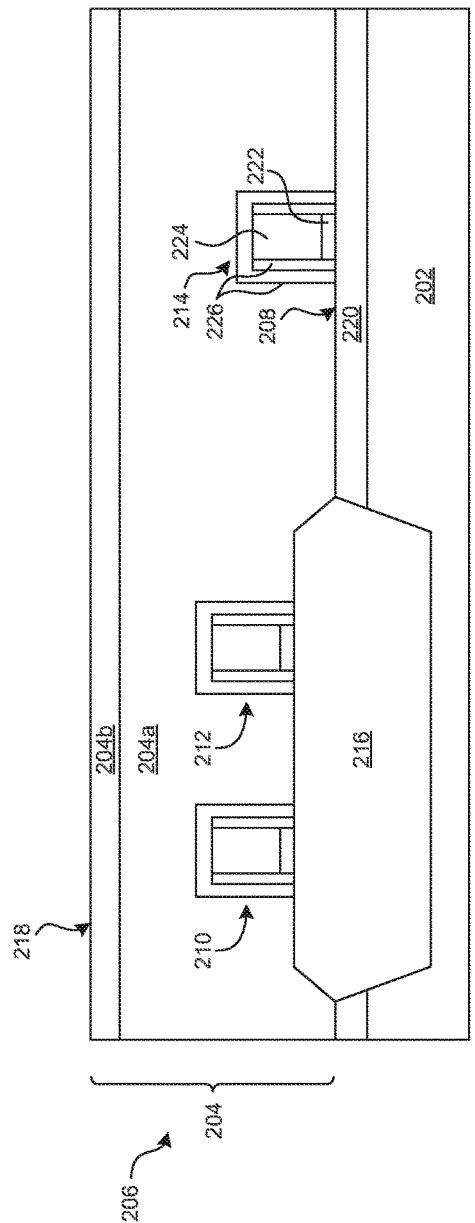
FIG. 2A illustrates a cross sectional view of portions of an FRAM cell during the fabrication thereof according to one embodiment of the present invention.

Referring to FIG. 1 and FIGS. 2A-2C, the process begins at block 102 in which openings 228a and 228b are formed in an inter-metal dielectric or first dielectric layer 204 after formation of an underlying gate level layer 206 on a surface 208 of a substrate 202. Additional openings may also be formed. As illustrated in FIG. 2A prior to forming the openings 228a and 228b, the gate level includes gate stacks of one or more metal-oxide-semiconductor (MOS) transistors 210, 212, 214 separated by, or located above, one or more isolation structures 216. The first dielectric layer 204 overlays the MOS transistors 210, 212, 214. In addition to a source and a drain, diffusion regions 220 can also include a channel region. Generally, the substrate 202 and, hence, diffusion regions 220, may be composed of any material suitable for semiconductor device fabrication. In one embodiment, the substrate 202 is a bulk substrate composed of a single crystal of a material which may include one or more of, but is not limited to, silicon, germanium, silicon-germanium, or an III-V compound semiconductor material. In another embodiment, the substrate 202 includes a bulk layer with a top epitaxial layer. In another embodiment, a bulk layer is composed of a single crystal of a material which may include one or more of, but is not limited to, silicon, germanium, silicon-germanium, a III-V compound semiconductor material, or quartz, while a top epitaxial layer is composed of a single crystal layer which may include one or more of, but is not limited to, silicon, germanium, silicon-germanium, or a III-V compound semiconductor material. The top epitaxial layer may be composed of a single crystal layer which may include one or more of, but is not limited to, silicon (i.e., to form a silicon-on-insulator (SOI) semiconductor substrate), germanium, silicon-germanium, or an III-V compound semiconductor material. An insulator layer may be composed of a material which may include one or more of, but is not limited to, silicon dioxide, silicon nitride, or silicon oxy-nitride. A lower portion of the bulk layer may be composed of a single crystal which may include one or more of, but is not limited to, silicon, germanium, silicon-germanium, an III-V compound semiconductor material, or quartz. Alternatively, the substrate 202, bulk layer, top epitaxial layer and the insulator material may be composed of other materials.

The substrate 202 and, hence, the channel region, may include dopant impurity atoms. In one embodiment, the channel region is doped P-type silicon and, and in another embodiment, the channel region is doped N-type silicon. Source and drain diffusion regions 220 in the substrate 202 have opposite conductivity to the channel region. For example, in one embodiment, the substrate 202 and, hence, the channel region, is composed of boron-doped single-crystal silicon having a boron concentration in the range of $1\times10^{15}$ atoms/cm$^3$ to $1\times10^{19}$ atoms/cm$^3$. Source and drain diffusion regions 220 may be composed of phosphorous- or arsenic-doped regions having a concentration of N-type dopants in the range of $5\times10^{16}$ atoms/cm$^3$ to $5\times10^{19}$ atoms/cm$^3$. Generally, source and drain diffusion regions 220 have a depth in the substrate 202 in the range of 80 nanometers to 200 nanometers. In accordance with an alternative embodiment of the present disclosure, source and drain diffusion regions 220 are P-type doped regions while the substrate 202 and channel region is an N-type doped region.

The MOS transistor 214 may include a gate oxide 222 formed on the surface 208 of the substrate 202, a gate layer 224 formed on the gate oxide 222, and one or more sidewall spacers 226 isolating the gate layer 224 from the first dielectric layer 204. Additionally, it is to be understood by those skilled in the art that the gate layer 224 is generally electrically coupled to an overlying local interconnect, which is described in more detail below.

The first dielectric layer 204 can include a single layer of dielectric material or multiple layers of dielectric material. For example, in one embodiment the first dielectric layer 204 includes a lower or bottom first dielectric layer 204a, which may include phosphosilicate glass (PSG) formed or deposited by a chemical vapor deposition (CVD) process, such as plasma or low pressure or atmospheric CVD. The first dielectric layer 204 may also include an upper or top first dielectric layer 204b, which may include a silicon oxide deposited by low pressure CVD (LPCVD) using tetraethylorthosilicate (TEOS) based process gas or precursors. Alternatively, other deposition chemistries may be used.

Figure 2B:
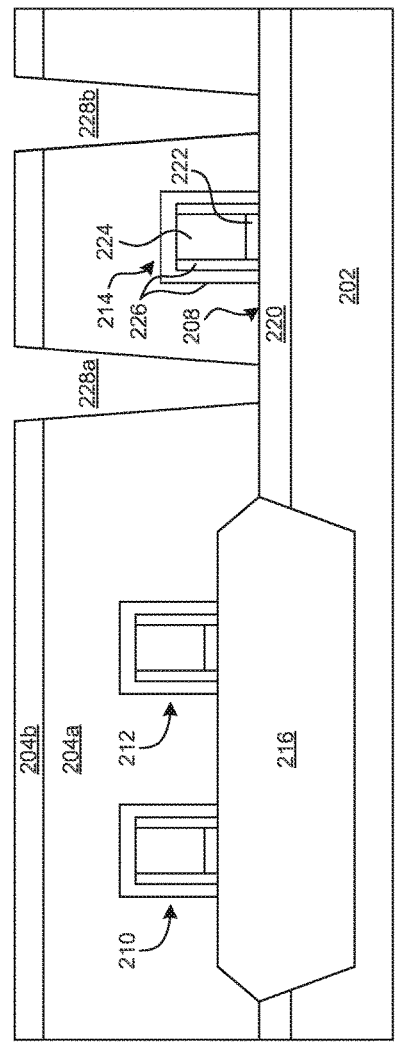
FIG. 2B illustrates another cross sectional view of portions of an FRAM cell during the fabrication thereof according to one embodiment of the present invention.

Referring back to FIG. 1 and to FIG. 2B, the openings 228a and 228b may be formed by performing a contact etch to etch the first dielectric layer 204 and expose the underlying diffusion regions 220. The contact etch can be accomplished using standard photolithographic techniques and any suitable wet or dry etching chemistry for etching a silicon oxide and/or PSG. Suitable contact etch chemistries can include, for example, wet etching using hydrofluoric acid (HF), or gas phase etching (GPE) using a reactive ion etch (RIE) process gas. Alternatively, other contact etch chemistries may be used.

Figure 2C:
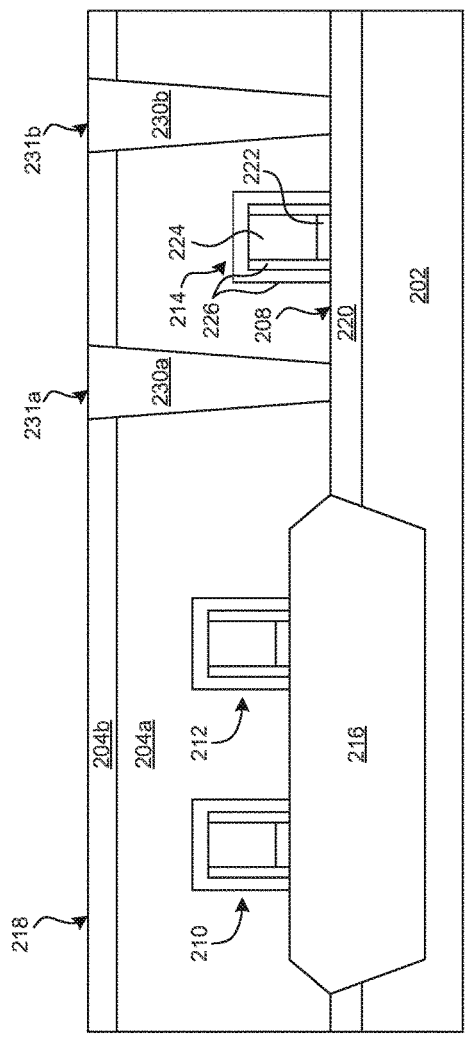
FIG. 2C illustrates another cross sectional view of portions of an FRAM cell during the fabrication thereof according to one embodiment of the present invention.

Referring back to FIG. 1 and to FIG. 2C, the openings 228a and 228b formed in the first dielectric layer 204 are filled with a metal (typically a refractory metal) to form lower metal contacts 230a and 230b. The term "refractory metal" refers to a metal of elements of the groups 4, 5 and 6 of the periodic table, including titanium (Ti), tantalum (Ta), tungsten (W), and nitrides or alloys thereof, which are resistant to high temperatures. The metal can be deposited, for example, by physical vapor deposition (PVD), such as sputtering or evaporation, or by CVD and electroless plating. After metal deposition, the lower metal contacts 230a and 230b and the upper surface 218 of the first dielectric layer 204 are planarized, for example, using a chemical mechanical polishing (CMP) process, resulting in planarized surfaces 231a and 231b of the lower metal contacts 230a and 230b, respectively, and a planarized upper surface 218 of the first dielectric layer 204.

Figure 2D:
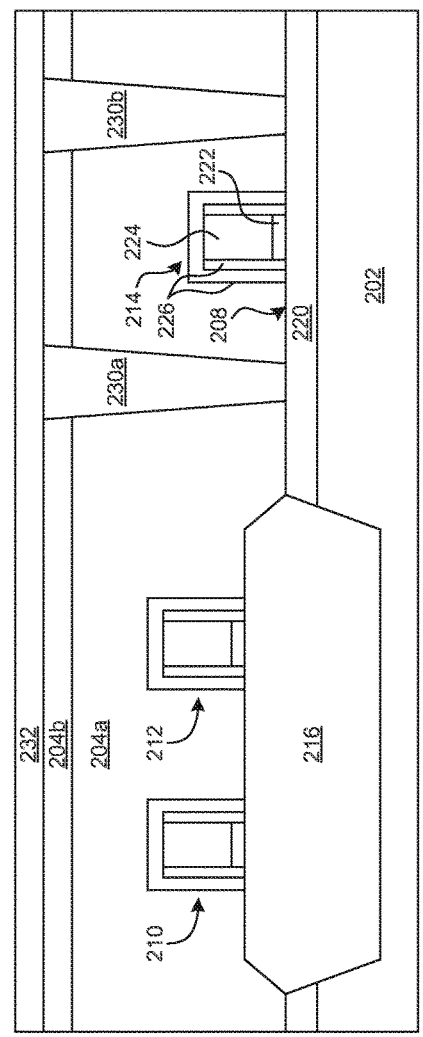
FIG. 2D illustrates another cross sectional view of portions of an FRAM cell during the fabrication thereof according to one embodiment of the present invention.

Referring to FIG. 1 and FIG. 2D, at block 104, one, two, or more layers of a hydrogen ($H_2$) barrier film 232 is deposited onto the upper surface 218 and the surfaces 231a and 231b of the lower metal contacts 230a and 230b, respectively. The hydrogen barrier film 232 can include a single material layer, or multiple material layers, and can have an overall thickness ranging from, for example, 50 nanometers to 200 nanometers. In one embodiment, the hydrogen barrier film 232 may include one or more layers of aluminum oxide ($Al_2O_3$), which may be deposited by ALD or PVD. In one embodiment, the hydrogen barrier film 232 may include one or more layers of silicon nitride (SiN), which may be deposited by CVD or ALD. Alternatively, other techniques may be used to deposit the one or more layers of the hydrogen barrier film 232.

Referring to FIG. 1 and FIG. 2E, trenches 234a and 234b are etched through the hydrogen barrier film 232, revealing planarized surfaces 231a and 231b of the lower metal contacts 230a and 230b, respectively. In one embodiment, the trenches 234a and 234b are etched using standard photolithographic and contact etching techniques (e.g., using an inverse mask), followed by treatment with an etch chemistry composed of carbon-monoxide (CO), argon (Ar), octafluorocyclobutane ($C_4F_8$) or Freon® 318, and, optionally, nitrogen ($N_2$). In some embodiments, other etch chemistries may be used.

Referring to FIG. 1 and FIG. 2F, at block 106, one or more layers of an oxygen barrier film are deposited, filling the trenches 234a and 234b of the hydrogen barrier film 232. In one embodiment, the oxygen barrier film can include one or more a layers of titanium aluminum nitride (TiAlN) and/or one or more layers of a different material. The oxygen barrier film may be deposited or formed using any suitable deposition method, such as CVD, atomic layer deposition (ALD), or PVD. After the oxygen barrier film has been deposited, the oxygen barrier film is planarized using, for example, a CMP process. The planarization may be performed until the oxygen barrier film disposed above the hydrogen barrier film 232 is removed, leaving behind oxygen barrier regions 236a and 236b within the trenches 234a and 234b, respectively. In one embodiment, the planarization may be performed until at least an upper portion of the hydrogen barrier film 232 is removed. The result of the planarization may be referred to as a damascene barrier film 237, which includes oxygen barrier regions 236a and 236b and a hydrogen barrier region defined by a remaining portion of the hydrogen barrier film 232, which collectively define an upper surface 237a and a lower surface 237b of the damascene barrier film 237. In one embodiment, the oxygen barrier regions 236a and 236b each have widths 270a and 270b, respectively, ranging from 0.1 to 1 micrometer. In one embodiment, the oxygen barrier regions 236a and 236b may be sized to match respective widths of the top portions of the lower metal contacts 230a and 230b. In another embodiment, the oxygen barrier regions 236a and 236b may be sized to be wider than the top portions of the lower metal contacts 230a and 230b. In one embodiment, a thickness of the damascene barrier film 237 is at least partially controlled by the planarization process.

Figure 2G:
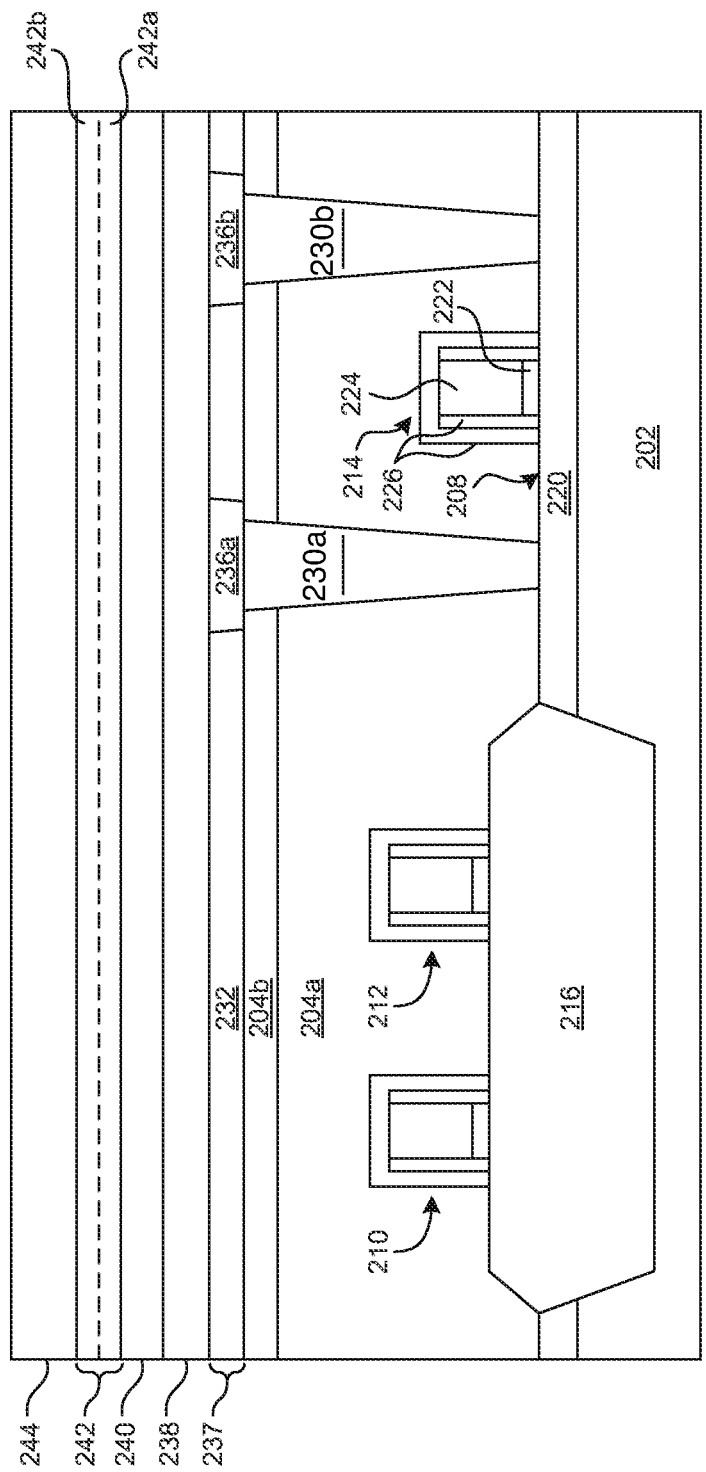
FIG. 2G illustrates another cross sectional view of portions of an FRAM cell during the fabrication thereof according to one embodiment of the present invention.

Referring to FIG. 1 and FIG. 2G, at block 108, layers of a ferro stack, from which one or more ferroelectric capacitors will be formed, are deposited or formed over the planarized damascene barrier film 237. Generally, the ferro stack layers include a layer of a ferroelectric material, such as a lead zirconate titanate (PZT) ferroelectric layer 240, between a top electrode 242 and bottom electrode 238 in electrical contact with or electrically coupled to one of the underlying lower metal contacts 230a and 230b via the oxygen barrier regions 236a and 236b, respectively. In some embodiments, the oxygen barrier regions 236a and 236b may be sized such that each is substantially the same width as the other. In other embodiments, the oxygen barrier regions 236a and 236b may be sized such that the oxygen barrier region 236a is wider than the oxygen barrier region 236b. In one embodiment, the top electrode 242 is a multilayer top electrode including, for example, a lower layer 242a of iridium oxide ($IrO_2$) in contact with the PZT ferroelectric layer 240 and an upper layer 242b of iridium (Ir) overlying the lower layer 242a of the top electrode 242. The PZT ferroelectric layer 240 is deposited on the bottom electrode 238 to a thickness ranging from, for example, 0.04 micrometers to 0.30 micrometers using MOCVD, ALD, or PVD. A hard mask 244 may be formed over the ferro stack layers. The hard mask 244 can include, for example, a layer of titanium aluminum nitride (TiAlN) having a thickness ranging from 0.1 micrometers to 0.4 micrometers, and can be deposited or formed using PVD. In certain embodiments, the hard mask 244 can include multiple layers and the material of the hard mask may be selected to form a conductive hydrogen ($H_2$) barrier. Alternatively, other materials and methods may be used to fabricate the ferro stack layers.

Figure 2H:
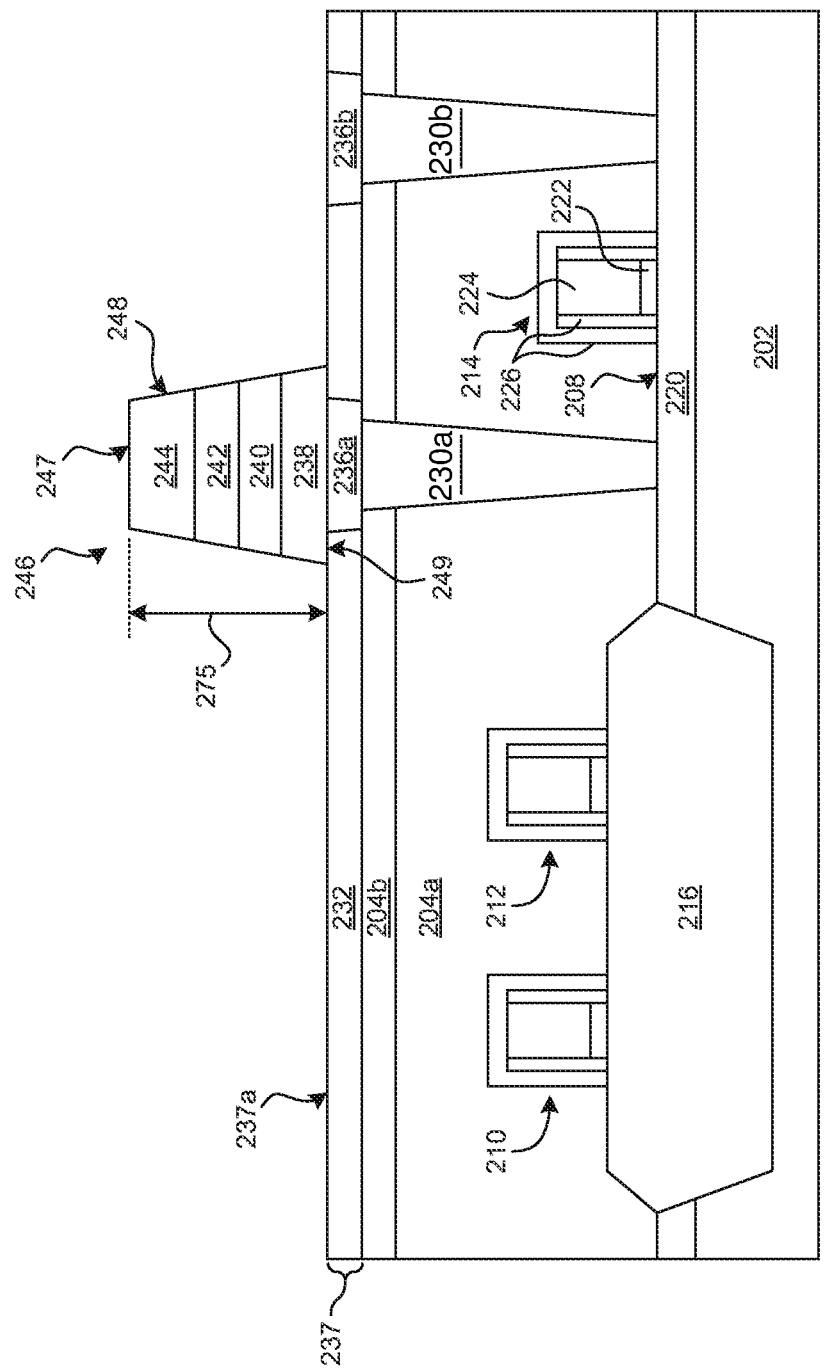
FIG. 2H illustrates another cross sectional view of portions of an FRAM cell during the fabrication thereof according to one embodiment of the present invention.

Referring to FIG. 1 and FIG. 2H, at block 110, the ferro stack layers may be patterned by first patterning the hard mask 244 and then using standard etching technologies, such as standard metal etch chemistries, to define a ferrocapacitor 246. The ferrocapacitor 246 includes a bottom electrode 238 (which is electrically coupled to the lower metal contact 230a), a PZT ferroelectric layer 240, a top electrode 242, and a hard mask 244, each of which correspond to their counterpart ferro stack layers described with respect to FIG. 2G. A top surface 247 of the ferrocapacitor 246 corresponds to an upper surface of the hard mask 244, and a bottom surface 249 of the ferrocapacitor 246 contacts the upper surface 237a of the damascene barrier film 237 such that the bottom surface 249 contacts the oxygen barrier region 236a, as illustrated in FIG. 2H. In such embodiments, when the oxygen barrier region 236a is narrower than the ferrocapacitor 246 (e.g., such that the bottom surface 249 of the ferrocapacitor 246 contacts the oxygen barrier region 236a and the hydrogen barrier film 232), this allows for design rules that may impose a minimum spatial separation between oxygen barrier regions 236a, 236b to be relaxed, thus allowing for a greater density of ferrocapacitors per FRAM cell. In other embodiments, the oxygen barrier region 236a is sized to be wider than the ferrocapacitor 246 such that the bottom surface 249 of the ferrocapacitor 246 fully contacts the oxygen barrier region 236a without contacting the hydrogen barrier film 232, or such that the bottom surface 249 of the ferrocapacitor 246 at least partially contacts the oxygen barrier region 236a and the hydrogen barrier film 232 (e.g., if the ferrocapacitor 246 is misaligned with respect to the oxygen barrier region 236a). In other embodiments, the oxygen barrier region 236a is the same width as the bottom surface 249 of the ferrocapacitor 246.

The ferrocapacitor 246 also includes one or more sidewalls 248 that run from the top surface 247 to the bottom surface 249. In one embodiment, the one or more sidewalls 248 are slanted with respect to the upper surface 237a of the damascene barrier film 237. In one embodiment, the ferrocapacitor 246 may be a round structure (e.g., a cylinder, a tapered cylinder, etc.) in which the sidewall 248 defines a circumference of the ferrocapacitor 246. In one embodiment, the ferrocapacitor 246 may be multi-walled of various shape (e.g., a cube, a trapezoid, an elongated cube, an elongated trapezoid, etc.) having multiple sidewalls 240a that define a perimeter. Alternatively, the ferrocapacitor 246 may have different shapes. It is noted that the ferrocapacitor 246 is illustrative, and that any suitable number of ferrocapacitors may be fabricated in accordance with the present embodiments. Moreover, each may be fabricated to have any suitable dimensions and/or shapes. In one embodiment, a height 275 of the ferrocapacitor 246 (e.g., as measured from the upper surface 237a of the damascene barrier film 237 to the top surface 247 of the ferrocapacitor 246) ranges from 0.2 micrometers to 0.5 micrometers.

Figure 2I:
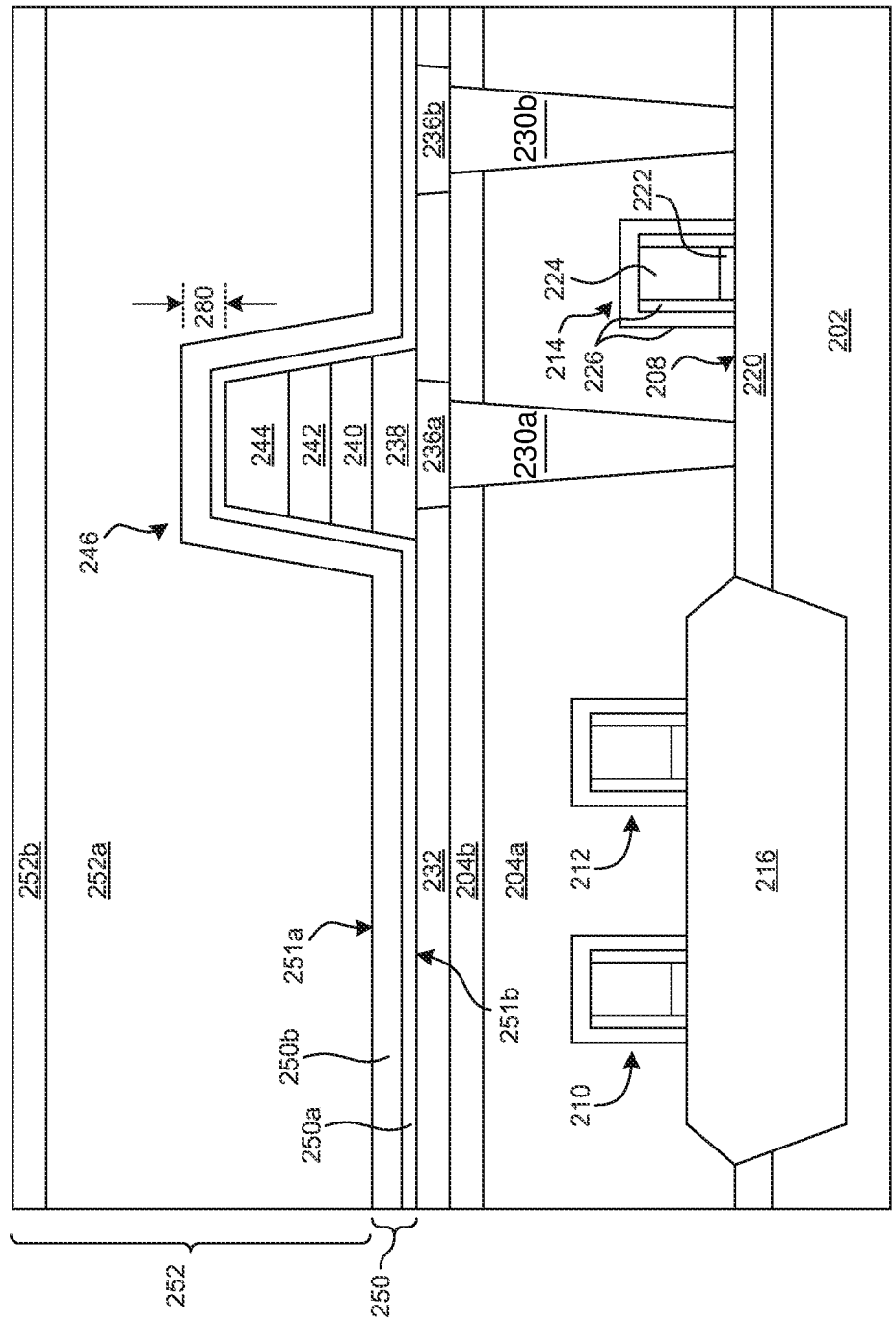
FIG. 2I illustrates another cross sectional view of portions of an FRAM cell during the fabrication thereof according to one embodiment of the present invention.

Referring to FIG. 1 and FIG. 2I, at block 112, one, two, or more layers of a hydrogen ($H_2$) barrier film 250 are deposited, the hydrogen barrier film 250 having an outer surface 251a and an inner surface 251b, such that the inner surface 251b of the hydrogen barrier film 250 contacts the top surface 247 and one or more sidewalls 248 of the ferrocapacitor 246 and the upper surface 237a of the damascene barrier film 237, encapsulating the ferrocapacitor between the hydrogen barrier film 250 and the damascene barrier film 237. Encapsulating the ferrocapacitor 246 in this way can prevent degradation that can occur when hydrogen is introduced during subsequent processing. The hydrogen barrier film 250 can include a single material layer, or multiple material layers, and can have an overall thickness 280 ranging from, for example, 10 nanometers to 130 nanometers. In one embodiment, the hydrogen barrier film 250 can include a lower or first hydrogen encapsulation layer 250a of aluminum oxide ($Al_2O_3$) having a thickness ranging from, for example, 5 nanometers to 30 nanometers, and may be deposited by ALD or PVD, and an upper or second hydrogen encapsulation layer 250b of silicon nitride (SiN) having a thickness ranging from, for example, 5 nanometers to 100 nanometers, and may be deposited by CVD or ALD. Alternatively, other techniques may be used to deposit the hydrogen barrier film 250.

After deposing the hydrogen barrier film 250, a second dielectric layer, referred to as an inter-level dielectric (ILD) layer 252, is deposited or formed over the hydrogen barrier film 250. The ILD layer 252 can include one or more layers of an undoped oxide, such as silicon-dioxide ($SiO_2$), a nitride, such as silicon nitride ($Si_xN_y$), a silicon-oxynitride ($Si_xO_yN_z$) or, as with the first dielectric layer 204 described above, an oxide, such as phosphosilicate glass (PSG). In one embodiment, the ILD layer 252 may include a lower layer 252a, which may be deposited by, for example, LPCVD using TEOS. Once the lower layer 252a is formed, an upper surface of the lower layer 252a may be planarized using, for example, a CMP process, resulting in a thickness of the lower layer 252a that ranges from 0.5 micrometers to 0.9 micrometers. In one embodiment, the ILD layer 252 may include an upper layer 252b, which may be deposited onto the lower layer 252a by, for example, LPCVD using TEOS. A thickness of the upper layer 252b may range from 0.1 micrometers to 0.4 micrometers.

Figure 2J:
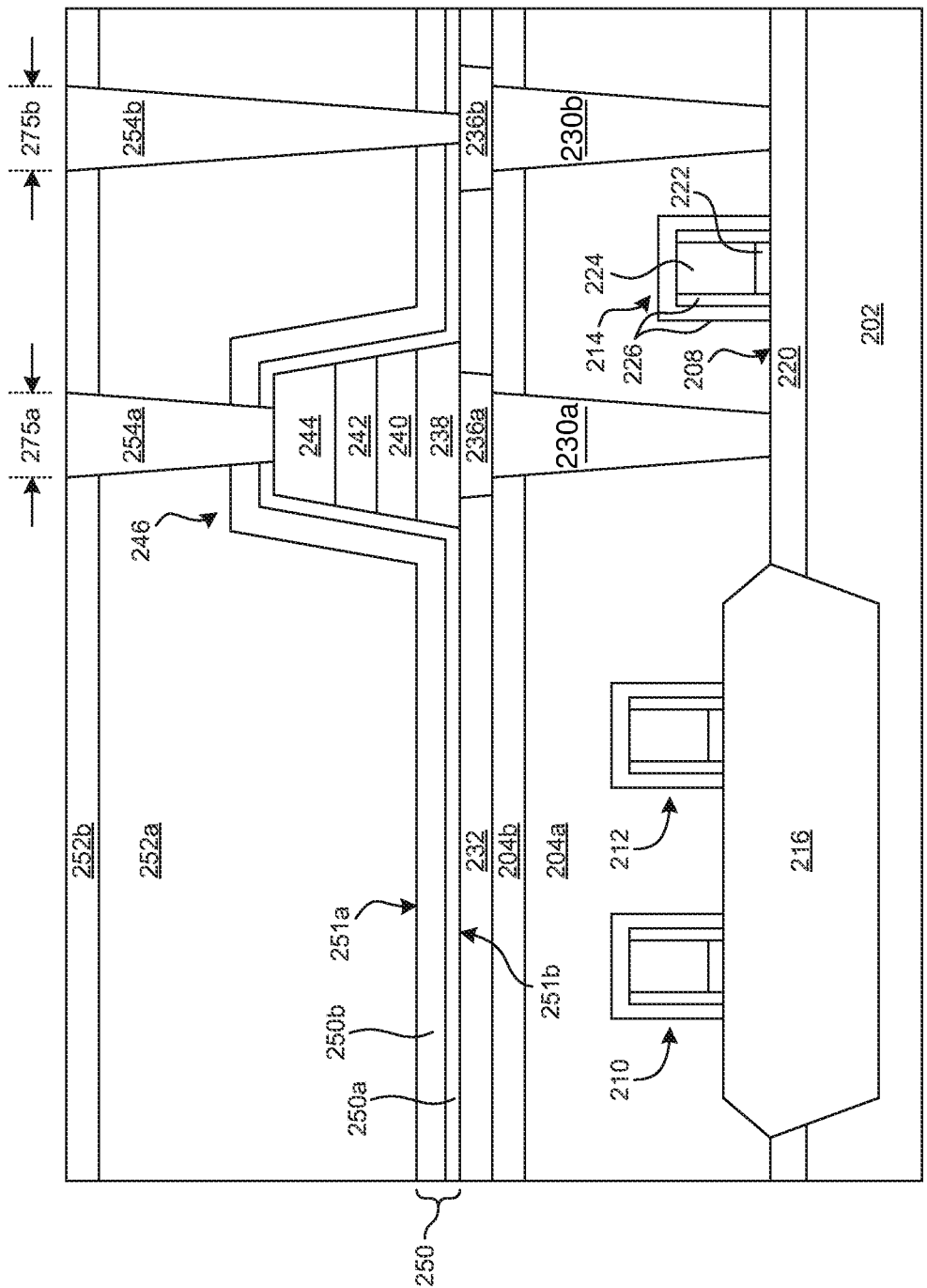
FIG. 2J illustrates another cross sectional view of portions of an FRAM cell during the fabrication thereof according to one embodiment of the present invention.

Referring to FIG. 1 and FIG. 2J, at block 114, openings for upper metal contacts 254a and 254b are etched through the ILD layer 252 and hydrogen barrier film 250 using standard photolithographic and contact etching techniques. For example, for an $SiO_2$ ILD layer, a suitable contact etching technique can include forming a patterned photoresist layer on the upper surface of the ILD layer and etching the ILD layer with an etch chemistry comprising carbon-monoxide (CO), argon (Ar), octafluorocyclobutane ($C_4F_8$) or Freon® 318, and, optionally, nitrogen ($N_2$). The opening for the upper metal contact 254a reveals the hard mask 244 and allow for electrical coupling of the top electrode 242 of the ferrocapacitor 246 to upper metal contact 254a. The opening for the upper metal contact 254b passes through the hydrogen barrier film 250 to reveal the second oxygen barrier region 236b of the damascene barrier film 237. The second oxygen barrier region 236b provides protection against oxygen diffusion during processing steps, and also serves as a "landing pad" for the upper metal contact 254 to provide electrical coupling to the lower metal contact 202b should the metal contacts be misaligned resulting from a manufacturing defect.

As with the lower metal contacts 230a and 230b described above, the upper metal contacts 254a and 254b may be formed in the ILD layer 252 by filling the openings with a refractory metal, such as titanium (Ti), tantalum (Ta), tungsten (W), and nitrides or alloys thereof, by physical vapor deposition, such as sputtering, evaporation, or CVD. After forming the upper metal contacts 254a and 254b, upper surfaces of the upper metal contacts 254a and 254b may be planarized using, for example, a CMP process.

The upper metal contacts 254a and 254b electrically couple any additional upper layers added downstream in the processing (e.g., by performing subsequent processing steps) and the gate level layer 206 below. The upper metal contact 254a directly contacts the hard mask 244 of the ferrocapacitor 246. The upper metal contact 254b connects directly to the lower metal contact 230b of the gate level layer 206 via the oxygen barrier region 236b of the damascene barrier film 237. The upper metal contacts 254a and 254b may be wider at their upper portions than at their lower portions, which may be an artifact of the ILD etching process. Widths 275a and 275b of the upper portions of the upper metal contacts 254a and 254b, respectively, are defined by a lithographic process used to etch the openings in the ILD layer 252. The widths 275a and 275b may each range from 65 nanometers to 200 nanometers.

Figure 2K:
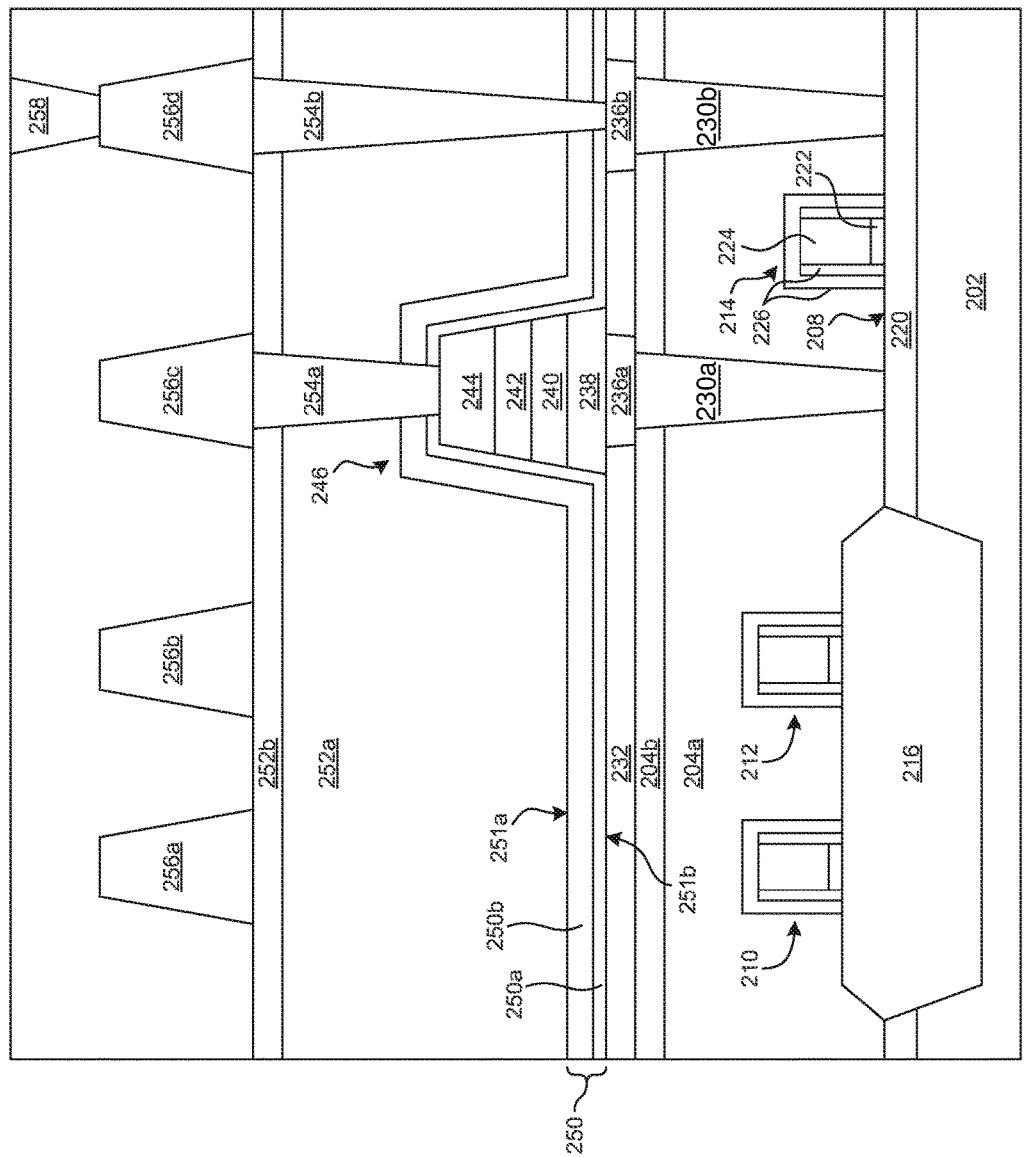
FIG. 2K illustrates another cross sectional view of portions of an FRAM cell during the fabrication thereof according to one embodiment of the present invention.

Referring to FIG. 1 and FIG. 2K, at block 116, additional processing steps may be performed. For example, metal contacts 256a, 256b, 256c, 256d, and 258 may be formed to provide additional connectivity within the FRAM cell.

Figure 3:
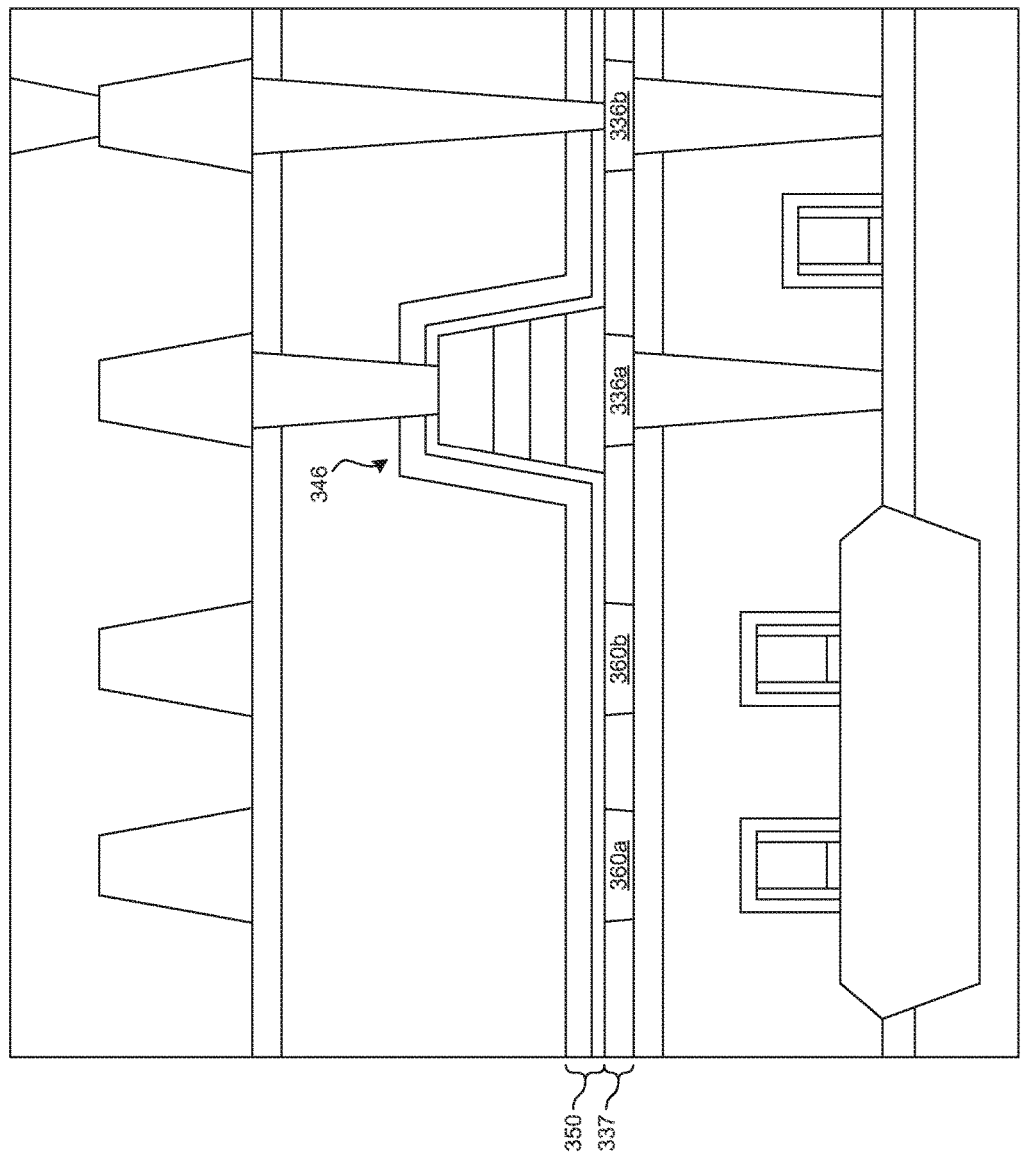
FIG. 3 illustrates a local interconnect layer formed according to one embodiment of the present invention.

FIG. 3 illustrates a local interconnect layer formed according to one embodiment of the present invention. The structure depicted in FIG. 3 may have been fabricated in a similar fashion as that of FIG. 2, except that additional oxygen barrier regions 360a and 360b have been included in order to define local interconnects. For example, blocks 104 and 106 may be modified to further allow for etching of additional trenches for which oxygen barrier regions 360a and 360b may be deposited. Accordingly, FIG. 3 depicts a structure having a ferrocapacitor 346 with a hydrogen barrier film 350 disposed thereon. A damascene barrier film 337 includes oxygen barrier regions 336a and 336b, as well as the oxygen barrier regions 360a and 360b that define the local interconnects. Each of these components may be the same or similar to their identically named counterparts described with respect to FIGS. 1 and 2. It is noted that the inclusion of local interconnects, as defined by the oxygen barrier regions 336a and 336b, is compatible with all of the embodiments described herein.

Figure 4:
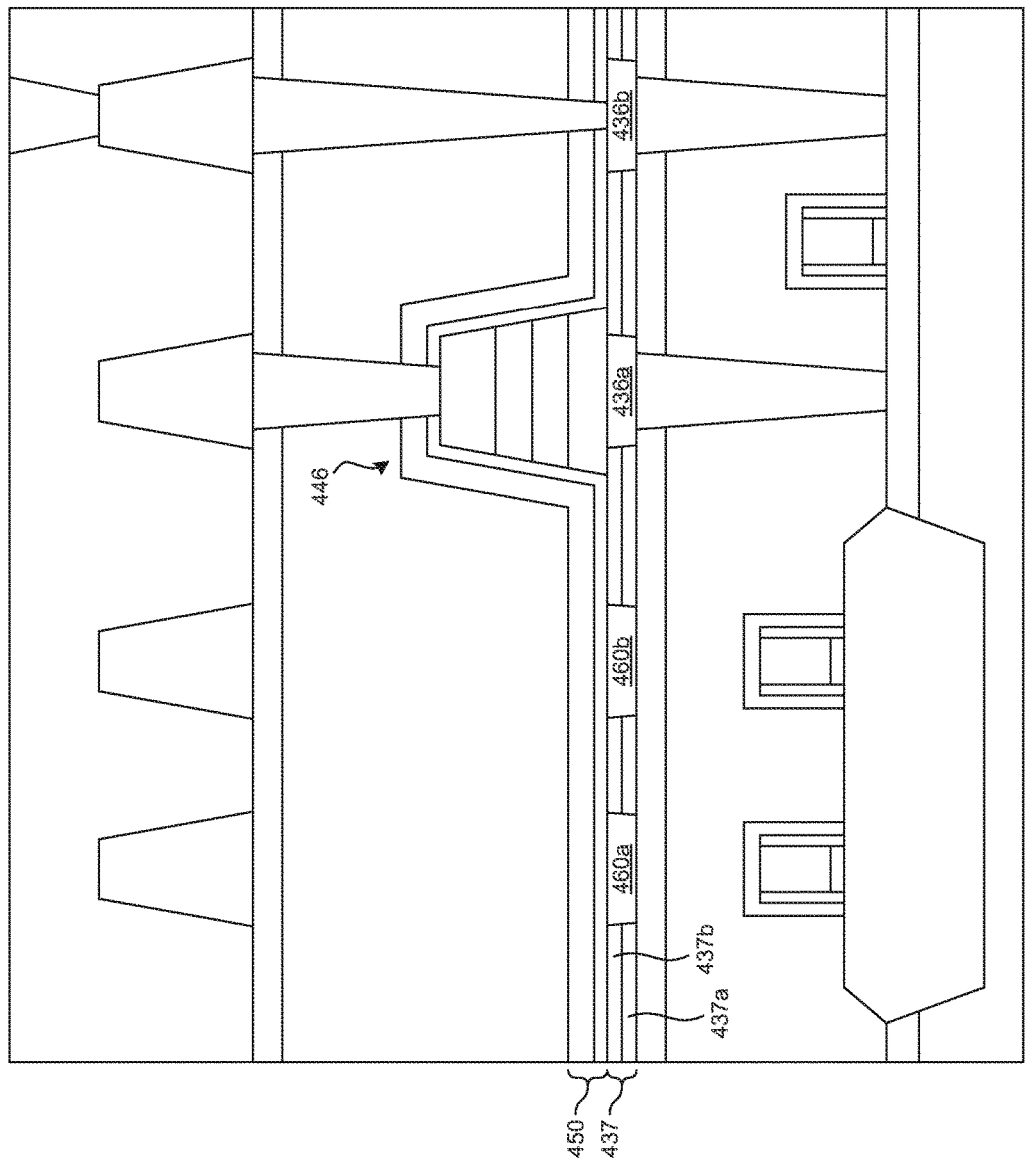
FIG. 4 illustrates a multi-layered damascene barrier film formed according to one embodiment of the present invention.

FIG. 4 illustrates a multi-layered damascene barrier film formed according to one embodiment of the present invention. The structure depicted in FIG. 4 may have been fabricated in a similar fashion as that of FIGS. 2 and 3, except that a damascene barrier film 437 includes a multi-layered hydrogen barrier film having a lower hydrogen barrier layer 437a and an upper hydrogen barrier layer 437b. Accordingly, FIG. 4 depicts a structure having a ferrocapacitor 446 with a hydrogen barrier film 450 disposed thereon. The damascene barrier film 437 includes the lower hydrogen barrier layer 437a, the upper hydrogen barrier layer 437b, oxygen barrier regions 436a and 436b, and oxygen barrier regions 460a and 460b that define local interconnects. Each of these components may be the same or similar to their identically named counterparts described with respect to FIGS. 1-3. It is noted that the inclusion of one, two, or more hydrogen barrier layers within a hydrogen barrier film is compatible with all of the embodiments described herein.

Figure 5:
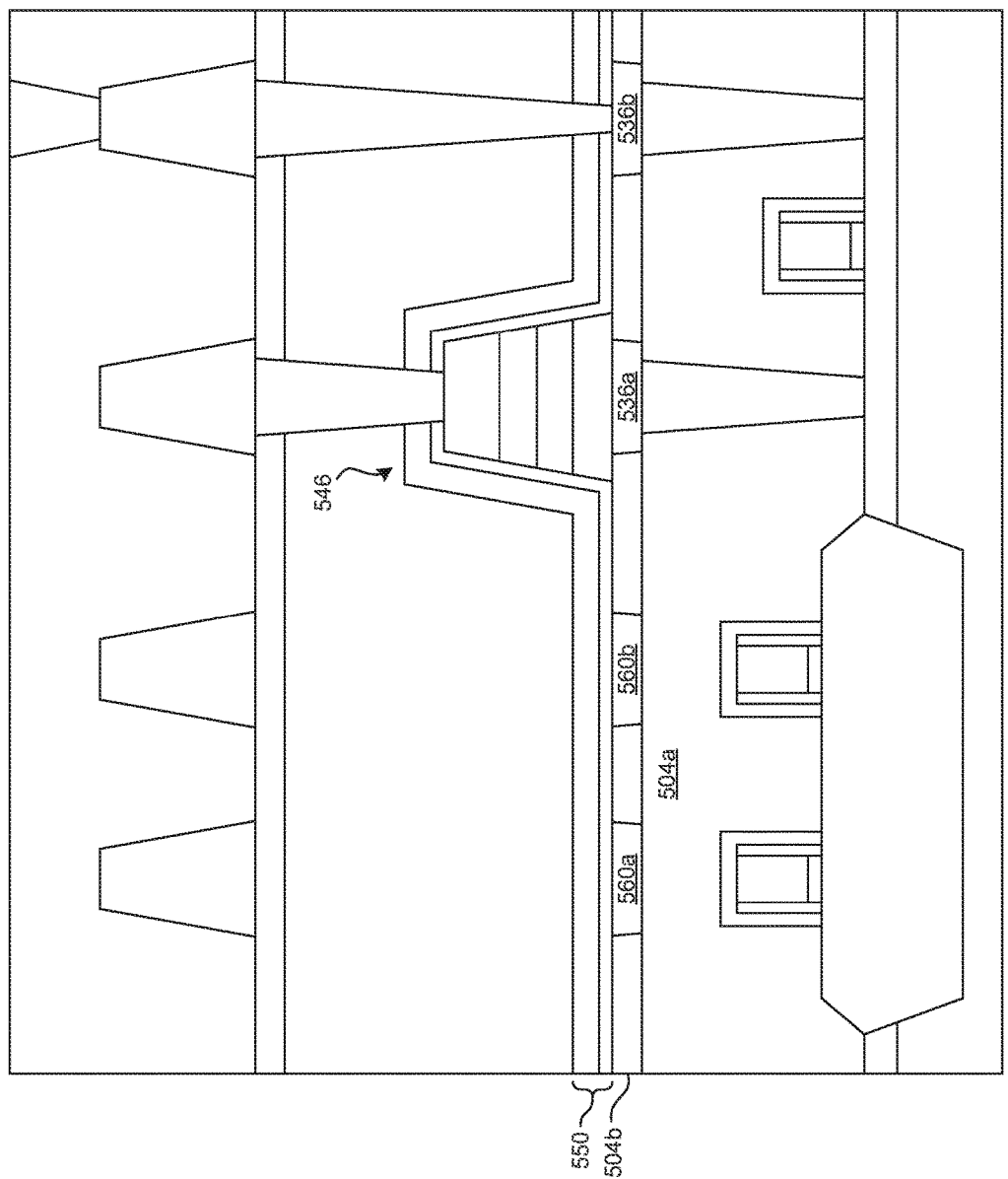
FIG. 5 illustrates a damascene barrier film formed within an oxide film according to one embodiment of the present invention.

FIG. 5 illustrates a damascene barrier film formed within an oxide film according to one embodiment of the present invention. The structure depicted in FIG. 5 may have been fabricated in a similar fashion as that of FIGS. 2-4, except that an upper oxide layer 504b has been modified to serve as a damascene barrier film. For example, blocks 102 and 106 may be modified to further allow for etching of trenches within the upper oxide layer 504b in which oxygen barrier regions 360a and 360b may be deposited, with blocks 104 being omitted to eliminate the hydrogen barrier film. Accordingly, FIG. 5 depicts a structure having a ferrocapacitor 546 with a hydrogen barrier film 550 disposed thereon. The upper oxide layer 504b is disposed on a lower oxide layer 504a, with the upper oxide layer 504b defining a damascene barrier film that includes oxygen barrier regions 536a and 536b, and oxygen barrier regions 560a and 560b that define local interconnects. Each of these components may be the same or similar to their identically named counterparts described with respect to FIGS. 1 and 2. In one embodiment, the lower metal contacts are formed prior to depositing the upper oxide layer 504b. In one embodiment, the upper oxide layer 504b is composed of a material that is suitable for serving as a hydrogen barrier (e.g., silicon nitride).

FIGS. 6A and 6B illustrate a processing defect formed in an FRAM cell. As shown in FIG. 6A, lower metal contacts 602a and 602b are formed through a lower 604a and upper 604b oxide layer. In some scenarios, planarization may result in depressed surfaces 603a and 603b of the lower metal contacts 602a and 602b, respectively. The depressed surfaces 603a and 603b may result in downstream defects in the FRAM cell if a damascene barrier film is not included. As shown in FIG. 6B, a ferrocapacitor 646 includes five layers: an oxygen barrier 636, a bottom electrode 638, a ferroelectric layer 640, a top electrode 642, and a hard mask 644. The depressed surface 603a introduces a defect that propagates through each of the layers of the ferrocapacitor 646, resulting in a deformed ferrocapacitor 646 that may demonstrate diminished and/or unpredictable performance during operation of the FRAM cell.

FIGS. 6C and 6D illustrate prevention of a processing defect in an FRAM cell formed according to one embodiment of the present invention. As shown in FIG. 6A, lower metal contacts 652a and 652b are formed through a lower 654a and upper 654b oxide layer. By including a damascene barrier film defined by, for example, a hydrogen barrier film (or portion) 660 and oxygen barrier regions 662a and 662b, defects resulting from planarization of the lower metal contacts 652a and 652b can be mitigated.

Thus, embodiments of FRAM cells that include damascene barrier films have been presented herein. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The terms "above," "under," "between," and "on" as used herein refer to a relative position of one layer with respect to other layers. As such, for example, one layer deposited or disposed above or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming the initial disk is a starting substrate and the subsequent processing deposits, modifies and removes films from the substrate without consideration of the absolute orientation of the substrate. Thus, a film that is deposited on both sides of a substrate is "over" both sides of the substrate.

In the foregoing description, numerous specific details are set forth, such as specific materials, dimensions, processes parameters, etc., to provide a thorough understanding of the present invention. In some instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, materials, or characteristics may be combined in any suitable manner in one or more embodiments.

The present invention has been described with reference to specific exemplary embodiments thereof. It will, however, be evident that various modifications and changes may be made thereto without departing from the broader scope of the embodiments of the invention as set for in the appended claims. The specification and drawings are, accordingly, to be regarded in an illustrative rather than a restrictive sense.

What is claimed is:

1. A method comprising:
    forming a damascene barrier film disposed above a gate level layer, the damascene barrier film comprising a hydrogen barrier region and a first oxygen barrier region formed adjacent to one another, and a planarized top surface, and wherein the damascene barrier film further comprises a second oxygen barrier region, wherein the second oxygen barrier region electrically couples an upper metal contact disposed above the damascene barrier film to a lower metal contact disposed within the gate level layer; and
    subsequent to forming the damascene barrier film, forming a ferrocapacitor, including sequentially forming a bottom electrode layer, a ferroelectric layer, and a top electrode layer, on the damascene barrier film, wherein a bottom surface of the ferrocapacitor contacts the first oxygen barrier region.

2. The method of claim 1, further comprising:
    forming a hydrogen barrier film above the ferrocapacitor and the damascene barrier film, wherein the ferrocapacitor is encapsulated between the hydrogen barrier film and the damascene barrier film.

3. The method of claim 1, wherein the damascene barrier film is formed on an oxide layer of the gate level layer.

4. The method of claim 1, wherein the hydrogen barrier region of the damascene barrier film comprises two or more hydrogen barrier layers.

5. The method of claim 1, wherein a height of the ferrocapacitor ranges from 0.2 micrometers to 0.5 micrometers.

6. The method of claim 1, wherein:
    the damascene barrier film comprises at least one additional oxygen barrier region,
    the damascene barrier film defines a local interconnect layer that comprises at least one local interconnect, and
    the at least one local interconnect includes the at least one additional oxygen barrier region.

7. A method of fabricating a memory device, comprising:
    forming a gate level layer overlying a substrate;
    forming a first lower contact inside the gate level layer;
    forming a first hydrogen barrier film overlying top surfaces of the gate level layer and the first lower contact;
    patterning the first hydrogen barrier film to form a first trench, wherein the first trench reaches the top surface of the first lower contact;
    forming an oxygen barrier film overlying the first hydrogen barrier film, and filling at least the first trench;
    performing planarization on the oxygen barrier film until a top surface of the first hydrogen barrier film is exposed and an oxygen barrier structure is formed within the first trench; and
    forming a ferroelectric capacitor including forming a bottom electrode layer over and in direct contact with the planarized top surface of the oxygen barrier structure of the damascene barrier, forming sequentially a ferroelectric layer, a top electrode layer, and a hard mask layer overlying the bottom electrode layer, and patterning the hard mask, top electrode, ferroelectric, and bottom electrode layers.

8. The method of claim 7, wherein forming the first lower contact includes:
    forming a first opening through the gate level layer;
    filling the first opening with a first conductive material; and
    performing planarization on the first conductive material such that the gate level layer and the first lower contact have a common planarized top surface.

9. The method of claim 7, wherein performing planarization on the oxygen barrier film forms a damascene barrier film including a remaining portion of the hydrogen barrier film and the oxygen barrier structure.

10. The method of claim 9, wherein the damascene barrier includes a planarized top surface.

11. The method of claim 10, wherein the planarized top surface of the damascene barrier includes planarized top surfaces of the remaining portion of the hydrogen barrier film and the oxygen barrier structure.

12. The method of claim 7, wherein the first hydrogen barrier film includes a multi-layer structure, the multi-layer structure including at least one of aluminum oxide and silicon nitride.

13. The method of claim 7, wherein the oxygen barrier film includes a multi-layer structure, the multi-layer structure including titanium aluminum nitride.

14. A method of fabricating a memory device, comprising:
    forming a damascene barrier film overlying a gate level layer, further including,
        forming a first hydrogen barrier film overlying a planarized top surface of the gate level layer,
        forming first and second trenches by removing portions of the first hydrogen barrier film, unremoved portions of the first hydrogen barrier film forming at least one hydrogen barrier structure,
        forming an oxygen barrier film overlying the at least one hydrogen barrier structure and filling at least the first and second trenches,
        performing planarization on the oxygen barrier film until a top surface of the at least one hydrogen barrier structure is exposed, and to form first and second oxygen barrier structures within the first and second trenches, respectively;
    forming a ferroelectric capacitor overlying the first oxygen barrier structure; and
    forming an upper contact overlying the second oxygen barrier structure.

15. The method of claim 14, wherein forming the ferroelectric capacitor comprises:
    forming a bottom electrode layer over and in direct contact with a planarized top surface of the damascene barrier film;
    forming sequentially a ferroelectric layer, a top electrode layer, and a hard mask layer overlying the bottom electrode layer;
    patterning the hard mask, top electrode, ferroelectric, and bottom electrode layers such that the patterned bottom electrode layer is in direct contact with a planarized top surface of the first oxygen barrier structure.

16. The method of claim 14, wherein performing planarization on the oxygen barrier film forms a planarized top surface of the damascene barrier film, and wherein the damascene barrier film includes the at least one hydrogen barrier structure disposed adjacent to at least one of the first or second oxygen barrier structures.

17. The method of claim 14, further comprising:
forming a second hydrogen barrier film overlying the damascene barrier film and the ferroelectric capacitor.

* * * * *